US007047468B2

(12) United States Patent
Belluomini et al.

(10) Patent No.: US 7,047,468 B2
(45) Date of Patent: May 16, 2006

(54) METHOD AND APPARATUS FOR LOW OVERHEAD CIRCUIT SCAN

(75) Inventors: Wendy Ann Belluomini, Austin, TX (US); Andrew K. Martin, Austin, TX (US); Chandler Todd McDowell, Austin, TX (US); Robert Kevin Montoye, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 10/670,832

(22) Filed: Sep. 25, 2003

(65) Prior Publication Data

US 2005/0071717 A1    Mar. 31, 2005

(51) Int. Cl.
*G01R 31/28* (2006.01)
(52) U.S. Cl. .................................. 714/731; 714/729
(58) Field of Classification Search .............. 708/254; 327/231; 365/189.05; 359/291; 714/729, 714/726, 731; 713/400; 710/240
See application file for complete search history.

(56) References Cited

U.S. PATENT DOCUMENTS

| | | | |
|---|---|---|---|
| 5,383,143 A * | 1/1995 | Crouch et al. ............... | 708/254 |
| 5,939,916 A * | 8/1999 | Jamal et al. ................. | 327/231 |
| 6,049,488 A * | 4/2000 | Sawada ................. | 365/189.05 |
| 6,327,071 B1 * | 12/2001 | Kimura ....................... | 359/291 |
| 6,748,564 B1 * | 6/2004 | Cullen et al. ................ | 714/729 |
| 6,848,060 B1 * | 1/2005 | Cook et al. .................. | 713/400 |
| 6,934,782 B1 * | 8/2005 | Stuber et al. ................ | 710/240 |

OTHER PUBLICATIONS

Hans Jacobson, et al., *Synchronous Interlocked Pipelined CMOS*, IBM Corporation, pp. 1-12.
Eric Mercer, et al., *Stochastic Cycle Period Analysis in Timed Circuits*, Electrical Engineering Department—University of Utah, pp. 1-4, Salt Lake City, Utah.

* cited by examiner

*Primary Examiner*—David Ton
(74) *Attorney, Agent, or Firm*—Casimer K. Salys; Dillon & Yudell LLP (57) ABSTRACT

A method and system for manipulating data in a state holding elements array. Process data is moved through the state holding elements array by a process controller. A separate scan controller scans data out of the state holding elements array by scanning data out of a group of cascaded latches where there are insufficient extra state holding elements in the group to enable normal scan. A multiplicity of local scan clocks are utilized to shift selected amounts of data only when a next state holding element in the group has been made available by clearing the contents of that next state holding element. In this way, any given latch, for the purpose of scan, is not a dedicated master or slave latch, but can act as either. This invention also addresses a circuit for the creation of the multiplicity of local clocks from a conventional LSSD clock source.

10 Claims, 8 Drawing Sheets

METHOD AND APPARATUS FOR LOW OVERHEAD CIRCUIT SCAN

BACKGROUND OF THE INVENTION

1. Technical Field

The present invention relates in general to a field of computers, and in particular to movement of data in state holding elements. Still more particularly, the present invention relates to a method and system for moving scan data through a data buffer using a reduced number of latches.

2. Description of the Related Art

Computing processor logic is typically made up of multiple clusters of processing logic and data latches that manipulates data according to machine instructions executed by the processing logic, or self-directed logic such as a programmable logic array (PLA) or a field programmable gate array (FPGA). A typical collection of logic and latches is shown in FIG. 1 as logic/latch array 100.

Logic/latch array 100 is made up of multiple state holding elements 102 (typically latches) and logics 104. Data bits are input into the top state holding elements 102 where the data bits are latched, and at a subsequent clock cycle are loaded into one or more logics 104. The results of the operations of the logics 104 are then outputted to one or more state holding elements 102, and so on until the final results are outputted at the bottom of the logic/latch array 100. A chip is composed of many such blocks of logic and latches. A common desire when a chip is manufactured to test whether there were any defects in the manufacturing process that may cause function different from that which would result from defect free manufacturing. A test program of data bits, a set of test vectors, inputted into the top of logic/latch array 100 will output known predicted results, output or result vectors, from the bottom of the logic/latch array 100 after a known number of clock cycles if the logic/latch array 100 is working properly. For a given block of logic a prohibitively large number of vectors may be required to determine if the logic/latch block is suitably free from defects. This large number of vectors can result from logic that responds/changes only to a very specific set of inputs and is often called random resistant logic. One solution is to carefully choose the vector so as to get high coverage. Another solution is to independently check smaller portions of the function. This can be accomplished by setting the state of the latches, clocking the system, and reading the results from the latches. The subfunctions between the latches should be less random resistant and also easier to determine vectors that cover a given percentage of the faults. Checking such intermediate calculations utilizes techniques such as level-sensitive scan design (LSSD), generalized scan design (GSD) test techniques, or simple scan design test techniques that enable testing at all levels of VLSI circuit packaging. The principles of the LSSD technique are described, for example, in U.S. Pat. No. 3,783,254, No. 3,784,907 and No. 3,961,252, all to Eichelberger and incorporated in their entirety by reference.

Figure 1:
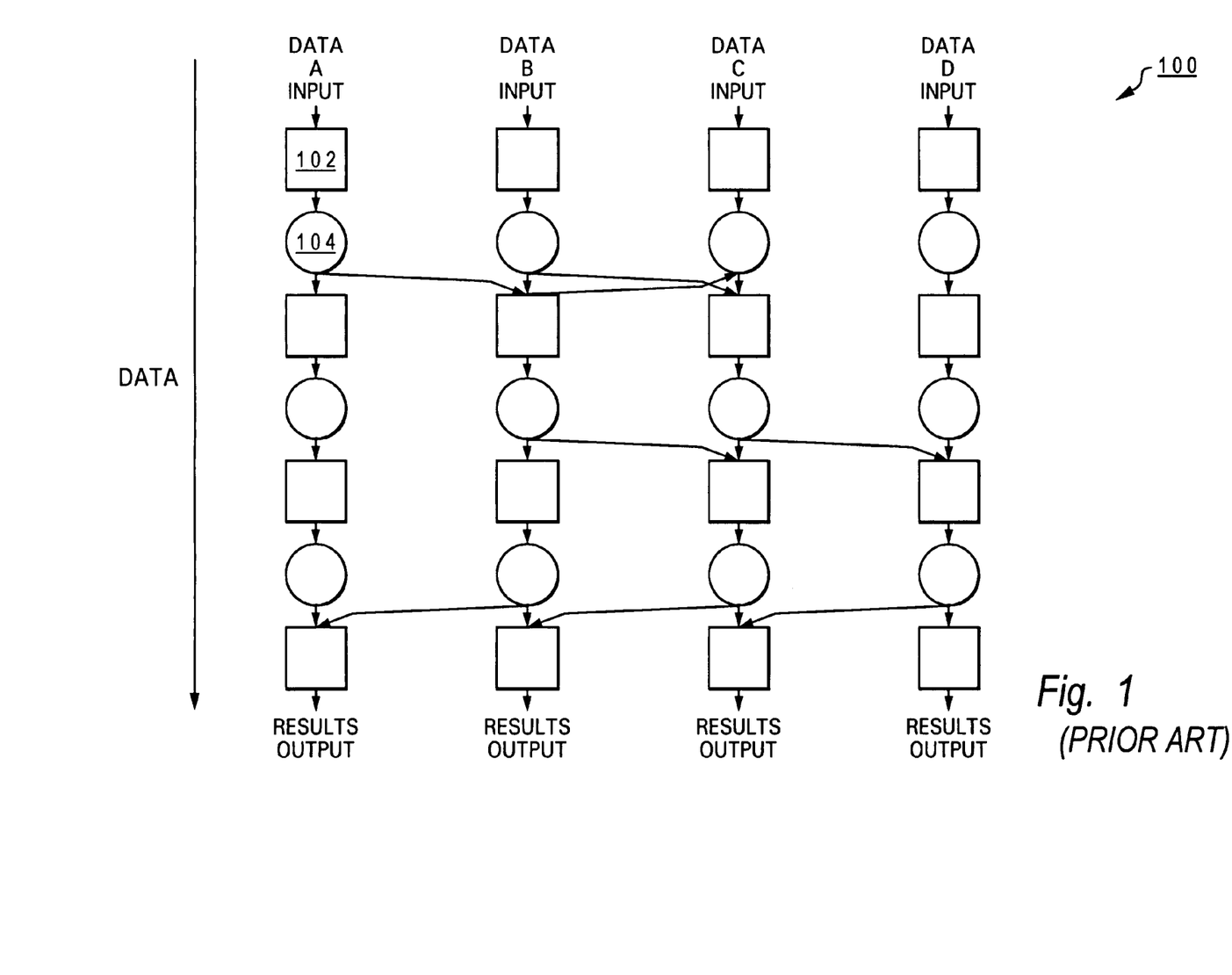
FIG. 1 depicts logic/latch array of state holding elements and processing logic.
Figure 2A:
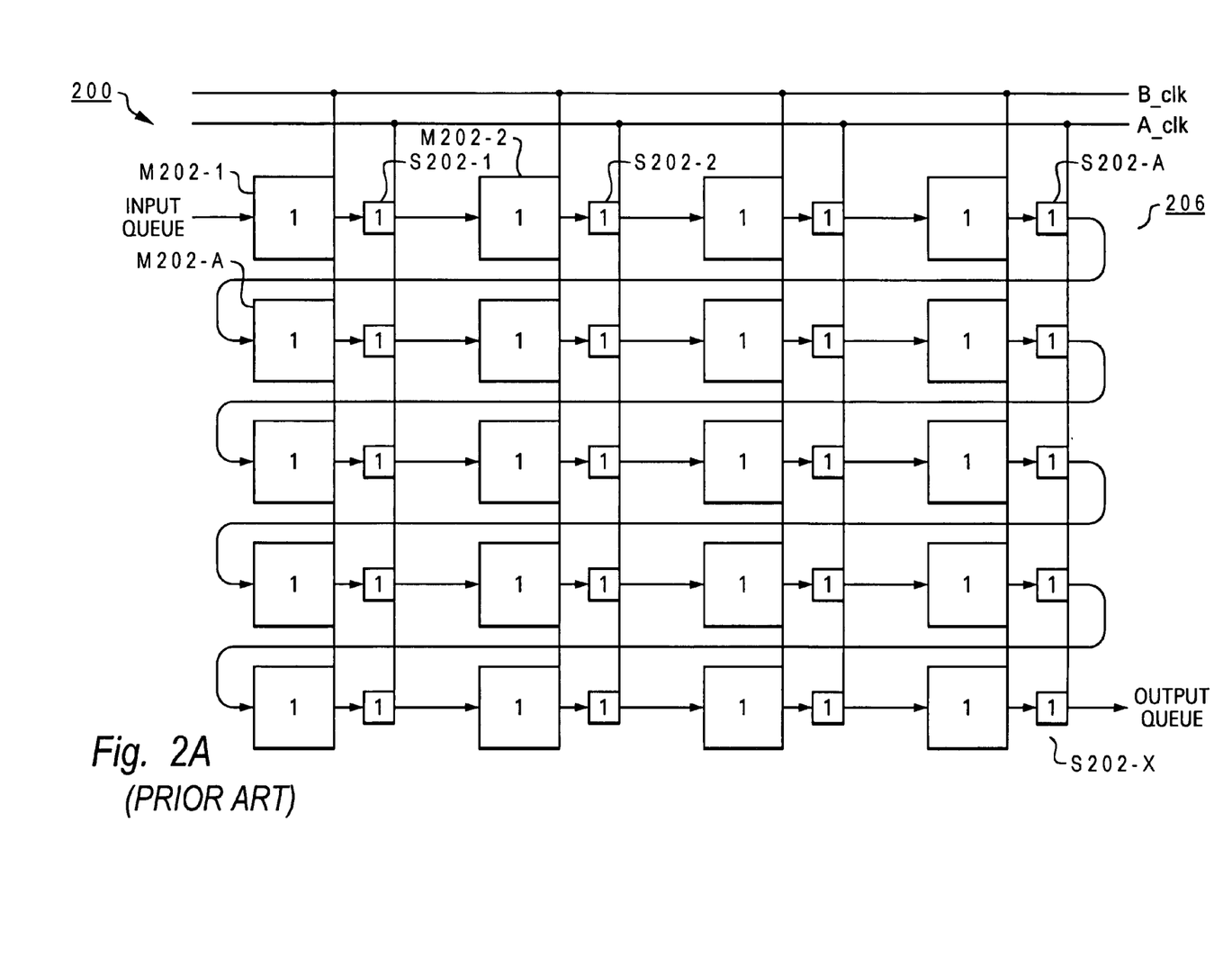
FIG. 2a illustrates an array of state holding elements having data serpentine scanned out.

FIG. 2a illustrates latch pairs 202, analogous to the state holding elements 102 shown in FIG. 1, that are used for scanning data out of a latch array 200 that holds intermediate results of operations performed by logics 104 as described above. (For purposes of clarity, note that FIG. 2a omits representations of logics 104 shown and described in FIG. 1.) To facilitate trustworthy scans, each latch pair 202 illustrated in FIG. 2a includes a master latch M202 and a slave latch S202. The slave latches S202 are necessary to ensure that data is not lost through timing mishaps that could occur if data bits were to be passed directly from a first master latch to a second master latch. During a scan-out process, a data bit in a first master latch is first scan/latched to a first slave latch, which then scans the data bit to a second master latch, which then passes the data bit to a second slave latch, and so on until the data bit safely scans (passes) through the entire latch array 200. As depicted in FIG. 2a, the latch array 200 of master latches M202 and slave latches S202 is under the clocking control of a first clock (A_clk) for the master latches M202 and a second clock (B_clk) for the slave latches S202. Thus, when a scan-out operation is performed, the data bits are scanned out in a serial serpentine manner as depicted, wherein the data bit in master latch M202-1 scans to slave latch S202-1, which scans the data bit to master latch M202-2, which scans the data bit to slave latch S202-2, and so on until the data bit is finally scanned out of latch array 200 through/from slave latch S202-x.

Figure 2B:
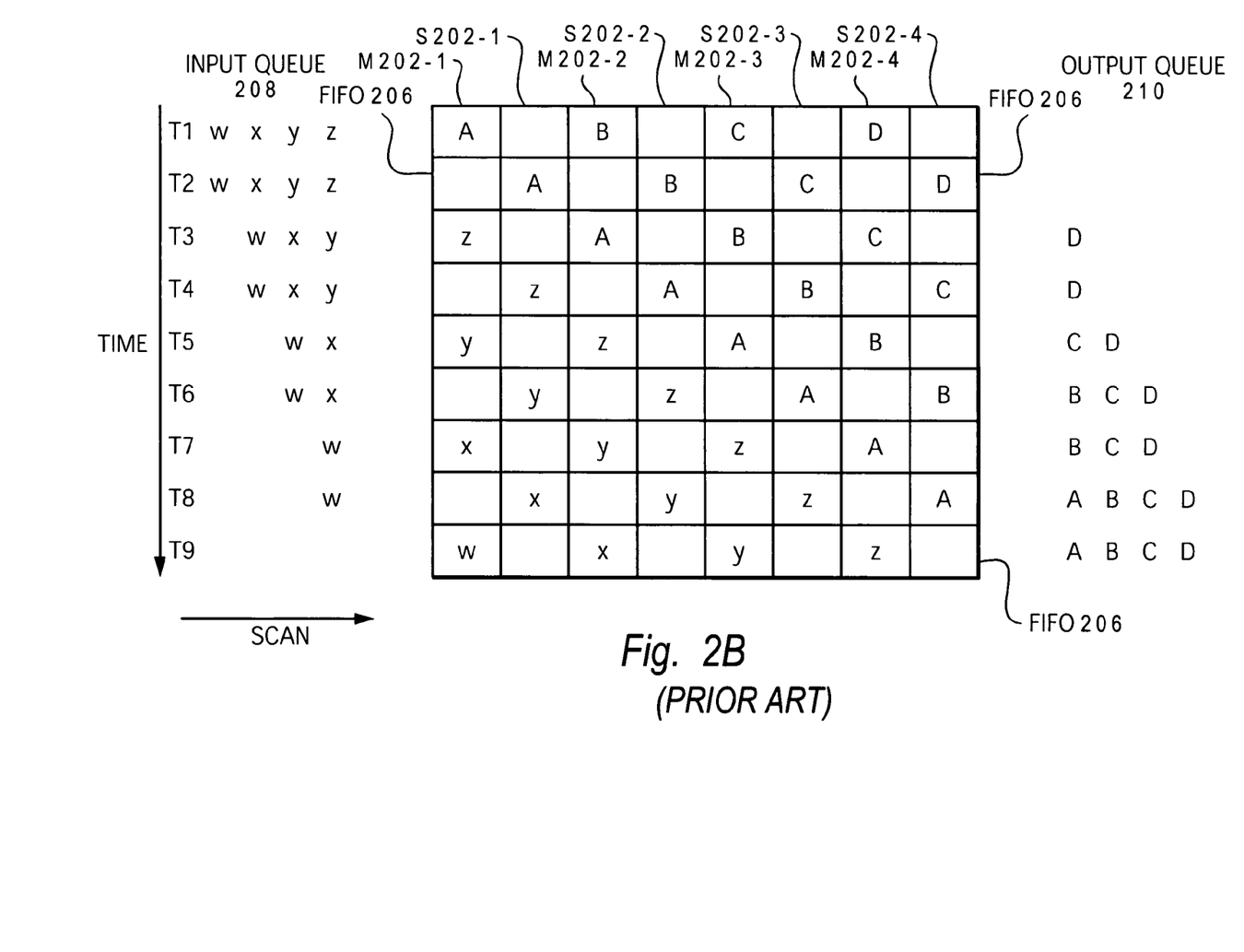
FIG. 2b depicts a single row of state holding elements having data scanned out using prior art master/slave latch pairs.

Referring now to FIG. 2b, there is depicted a block diagram of four master/slave latch pairs being scanned out. Assume in FIG. 2b that instead of twenty master/slave latch pairs M202/S202, as depicted in FIG. 2a, there are only four master/slave latch pairs M202-1/S202-1 through M202-4/S202-4 in a First-In First Out (FIFO) 206, as depicted. At initial time "T1", input queue 208 holds data elements "w, x, y, z," each master latch M202 holds a significant data bit (such as a result of an intermediate operations performed by some piece of logic), each slave latch S202 is empty or in a "don't care" state, and the output queue 210 is empty (or in a "don't care state). At time "T2", all the data bits are shifted into the available slave latches. Thus, data bit "A" scans from master latch M202-1 to slave latch S202-1, data bit "B" scans from master latch M202-2 to slave latch S202-2, data bit "C" scans from master latch M202-3 to slave latch S202-3, and data bit "D" scans from master latch M202-4 to slave latch S202-4.

Moving on to time "T3", the data bits are shifted into the master latches either from slave latches or from the external queue. In addition a data bit will be shifted to the output queue. So, data bit "z" from input queue 208 shifts into master latch M202-1, data bit "A" scans from slave latch S202-1 into master latch M202-2, data bit "B" scans from slave latch S202-2 into master latch M202-3, data bit "C" scans from slave latch S202-3 into master latch M202-4, and data bit "D" scans from slave latch S203-4 into output queue 210. (Note that input queue 208 and output queue 210 may also have master/slave latch pairs (not shown) as depicted for FIFO 206.)

Continuing along the time line in FIG. 2b, significant data bits are continued to be scanned out of FIFO 206 until time "T9", at which time all of the leading data bits (w, x, y, z) originally in input queue 208 are scanned into FIFO 206, and all of the significant data bits (A, B, C, D) are scanned out of FIFO 206 into output queue 210.

The main purpose of the slave latches S202 depicted in FIGS. 2a and 2b is to ensure that data is properly passed and scanned from master latch M202 to subsequent master latch M202 without being lost. However, as pipelines get finer, and the number of latches increases, the use of pulse latches and merged logic latches, which do not have an already available slave latch may become more common. Adding a dedicated slave latch to each master latch, if not already there, becomes very costly in terms of chip space and power consumption. Therefore, there is a need for a method and system of data scanning that do not require slave latches dedicated to each master latch in a logic/latch matrix

SUMMARY OF THE INVENTION

The present invention is directed to a method and system for manipulating data in a state holding elements array. Process data is moved through the state holding elements array by a process controller. A separate scan controller scans data out of the state holding elements array by scanning data out of a group of cascaded latches where there are insufficient extra state holding elements in the group to enable normal scan. A multiplicity of local scan clocks are utilized to shift selected amounts of data only when a next state holding element in the group has been made available by clearing the contents of that next state holding element. In this way, any given latch, for the purpose of scan, is not a dedicated master or slave latch, but can act as either. This invention also addresses a circuit for the creation of the multiplicity of local clocks from a conventional LSSD clock source.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

FIG. 4b depicts the timing chart of clock signals created by the circuit illustrated in FIG. 4a;

DETAILED DESCRIPTION OF A PREFERRED EMBODIMENT

Figure 3A:
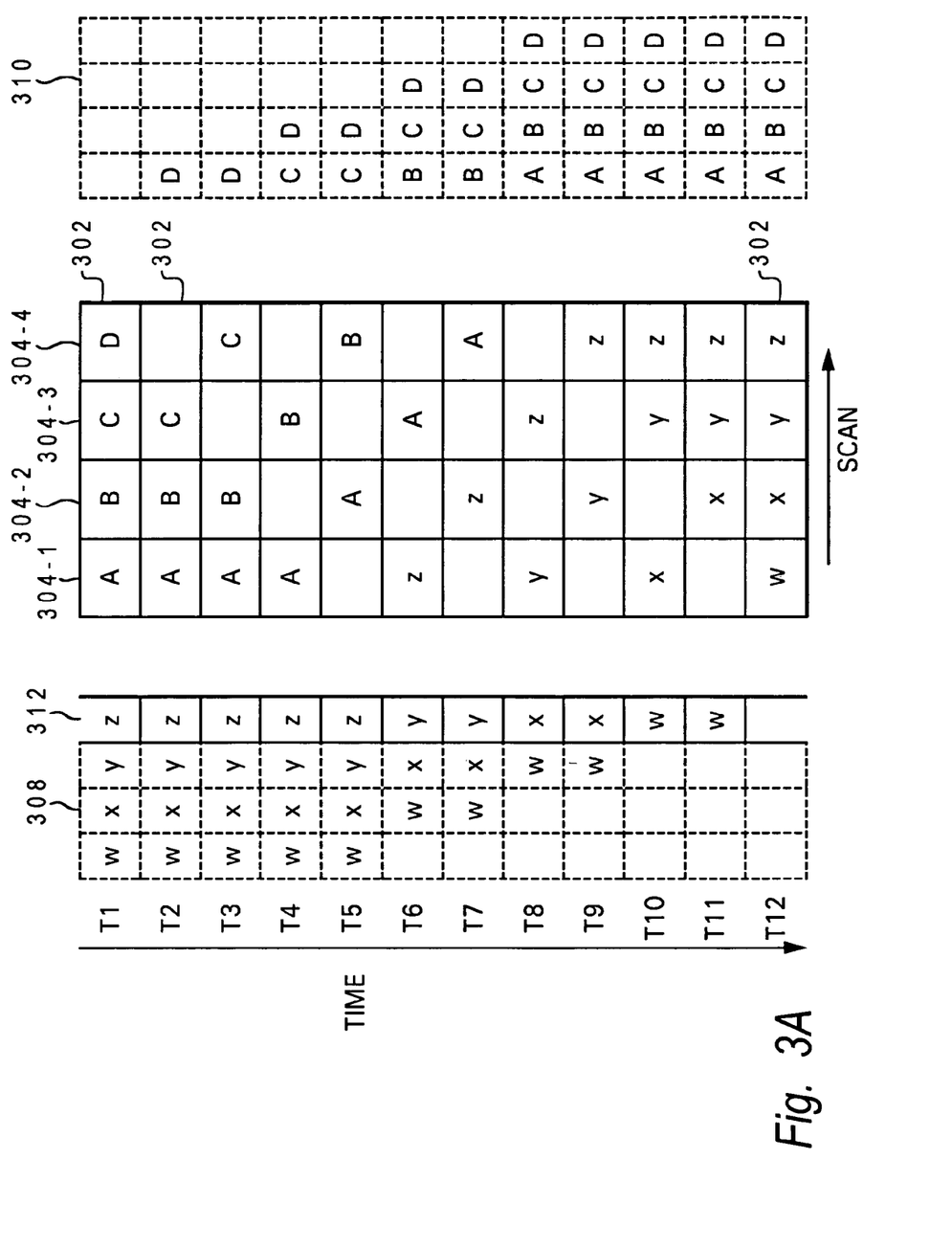
FIG. 3a illustrates scanning out of data in a row of latches utilizing the present invention, in which no slave latches are dedicated to master latches.

With reference now to FIG. 3a, there is illustrated an exemplary flow of data being scanned out of a row (i.e., cascaded group) of state holding elements shown as a FIFO (First In First Out) 302. An input queue 308 (which may be of any form and may not use master/slave latches) holds leading data bits "w, x, y, z." Input queue 308 includes an input scan latch 312, which holds the next bit of data to be scanned into FIFO 302 as described below. Input queue 308 may hold data created by an interrupt, a test scan, or any other data used by those skilled in the art for scanning into a shift register, FIFO or similar.

At time "T1", FIFO 302, which includes four latches 304-1 through 304-4, holds intermediate result data "A, B, C, D." At time "T2", the only data that can scan out of FIFO 302 is the data bit "D" in latch 304-4, since output queue 310 is presumed to always be capable of accepting data being scanned out of FIFO 302. At time "T3", data bit "C" is able to scan to latch 304-4, which was made available at time "T2" when data bit "D" was scanned out of latch 304-4. At time "T4", data bit "B" is able to scan out of latch 304-2 into empty latch 304-3, and data bit "C" is able to scan out of latch 304-4 into output queue 310. Data continues to scan out of input queue 308 (via input scan latch 312) and out of FIFO 302 as illustrated until all of the intermediary result data (A, B, C, D) in FIFO 302 is scanned out to output queue 310. The timing of this scan out of FIFO 302 can be visually conceptualized as cars pulling away from a traffic light (at times T1 through T5), driving down the road (at times T6 through T8) and stopping at another light (at times T9 through T12). When pulling away from a traffic light, a car can only move if there is an opening in front. Similarly, as cars pull up to a traffic light, spaces between cars are filled up as they come to a stop.

Figure 3B:
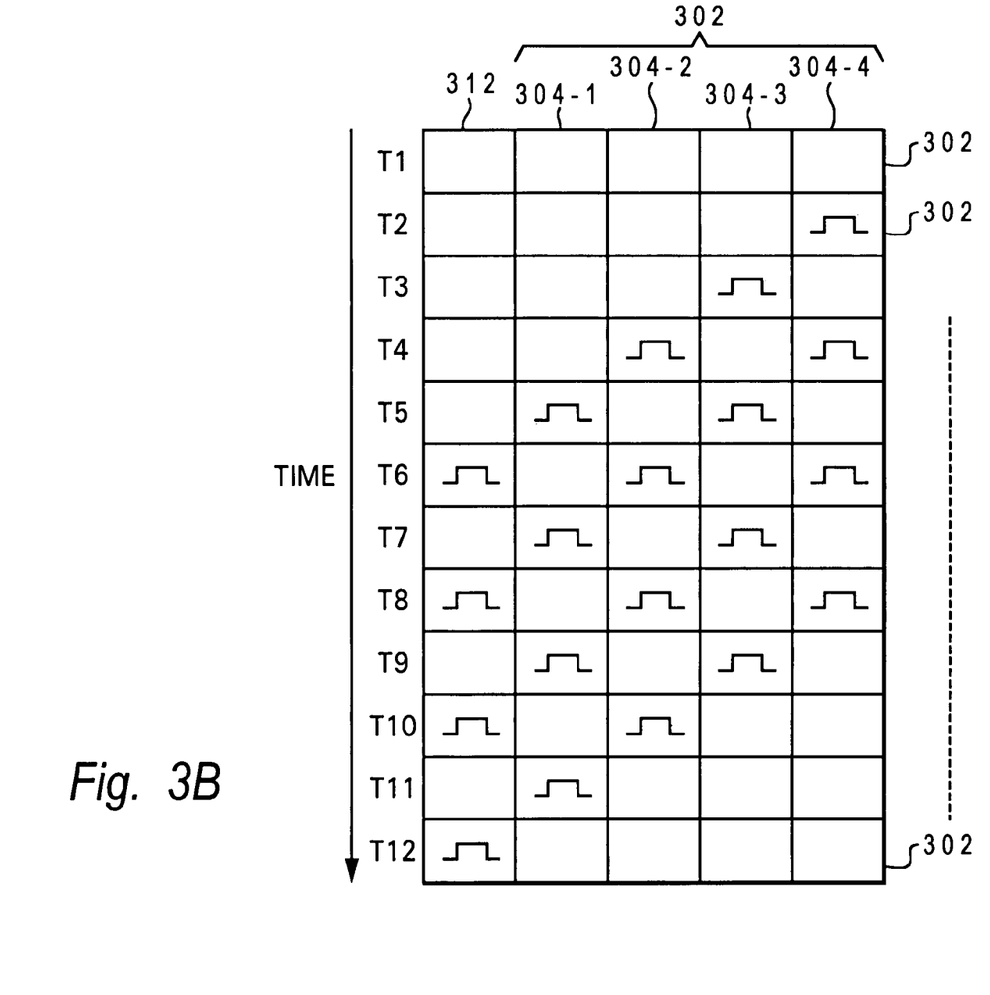
FIG. 3b depicts clock signals received in different state holding elements in a row to control the scan-out of data from the row.

The timing for clocks in each of the latches 304-1 through 304-4 is shown in FIG. 3b. Each depicted clock cycle describes the time at which one or more data bits are able to scan (shift) as shown in FIG. 3a. The timing shown in FIG. 3b is critical for accomplishing the pattern of data scanning shown in FIG. 3a. A preferred circuit for accomplishing this timing pattern is shown in FIG. 4.

Figures 4A, 5B, 5C:
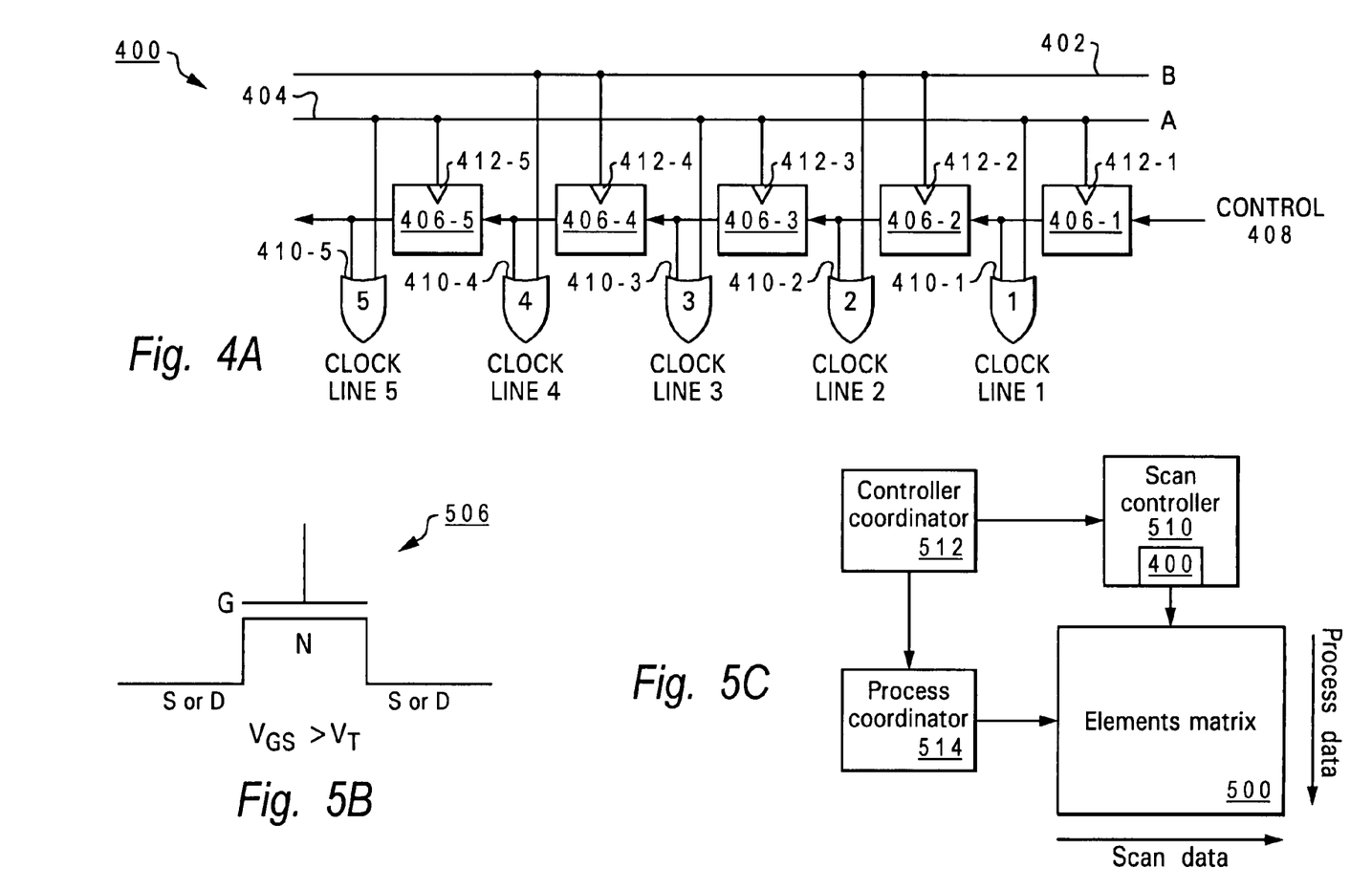
FIG. 4a illustrates a circuit used in a preferred embodiment of the present invention to create a sequence of clock signals from a split clock signal.
FIG. 5b illustrates a preferred passgate used to control passage of data between state holding elements during a scan out operation.
FIG. 5c is a block diagram of the preferred embodiment of the present invention.

As illustrated in FIG. 4a, timing circuit 400 includes a B_clock line 402 and an A_clock line 404. A_clock line 404 is connected to the enable input 412-1 of clock latch 406-1 and the input of clock AND gate 410-1 as shown. Control line 408 is connected to the input of first clock latch 406-1. The output of clock latch 406-1 is connected to the input of clock AND gate 410-1 and to the data input of second clock latch 406-2. B_clock line 402 is connected to the enable input 412-2 of clock latch 406-2 and to the input of clock AND gate 410-2. Similarly, A_clock line 404 is connected to the enable inputs 412-3 and 412-5 of respective clock latches 406-3 and 406-5 as well as the inputs of clock AND gates 410-3 and 410-5. Likewise, B_clock line 404 is connected to the enable input 412-4 of clock latch 406-4 and to the input of clock AND gate 410-4. The output of clock latch 406-2 is connected to the input of clock latch 406-3 and the input of clock AND gate 410-2, the output of clock latch 406-3 is connected to the input of clock latch 406-4 and the input of clock AND gate 410-3, the output of clock latch 406-4 is connected to the input of clock latch 406-5 and the input of clock AND gate 410-4, and the output of clock latch 406-5 is connected to the input of clock AND gate 410-5 as shown.

Figure 4B:
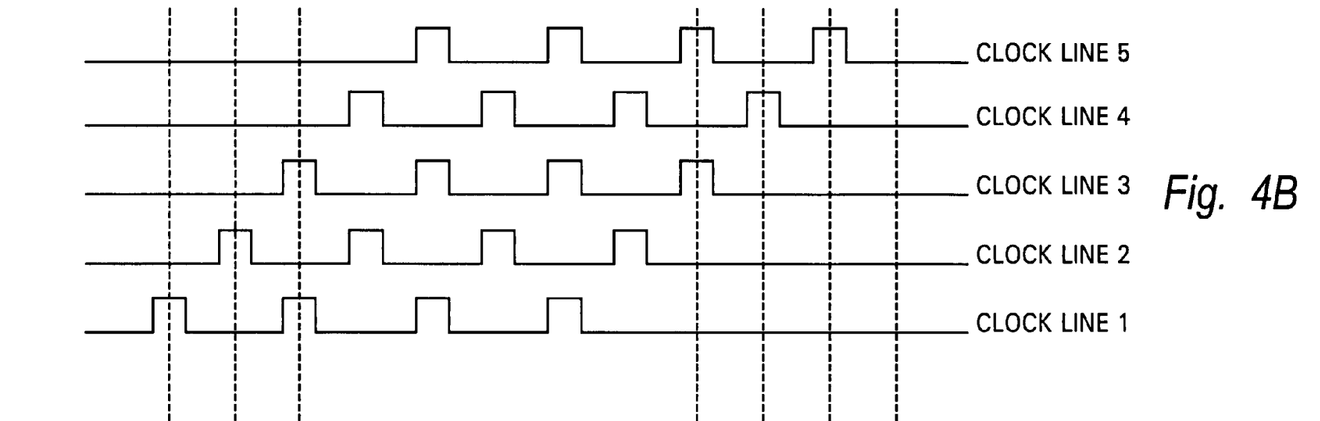
Figure 4C:
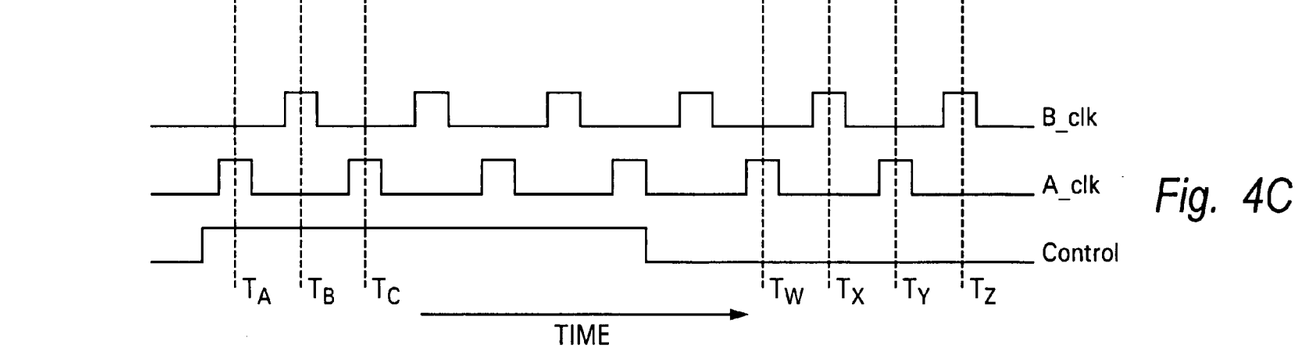
FIG. 4c illustrates clock and input signals used to generate the clock signals depicted in FIG. 4b.

The timing of the B_clk signal on B_clock line 402, A_clk signal on A_clock line 404, and the Control signal on control line 408, said signals shown in FIG. 4c, result in the clock signals shown in FIG. 4b when all clock latches 406 are initially latched to zero. For example, at time "Ta", the control signal is high, the A_clk signal is high, and the B_clk signal is low. This results in clock latch 406-1 latching a high signal when clocked by the A_clk high signal, and thus clock latch 406-1 has a high output signal. This high signal is logically AND'ed in clock AND gate 410-1 with the A_clk signal, resulting a high clock cycle as shown in FIG. 4b for clock line 1 at time Ta. Since clock latches 406-2 through 406-5 still have their initial contents latched low, the clock lines 2–5 remain low (no clock signal) since the outputs of clock latches 406-2 through 406-5 are all low, which prevents a clock signal from either A_clock line 404 or B_clock line 402 from passing through clock AND gates 410-2, 3, 4 or 5.

Moving on to time "Tb" in FIG. 4c, the control signal remains high, but now A_clk is low and B_clk is high. At time Tb then, clock latch 406-1 continues to output a latched high signal, but the A_clock line 404 now is not outputting a clock signal, and thus the output of clock AND gate 410-1 is low (no clock pulse). Clock latch 406-2 received a high input from clock latch 406-1 when clock latch 406-2 is enabled by the B_clk signal from B_clock line 402 at time Tb. Thus, the inputs to clock AND gate 410-2 are a high signal from the output of clock latch 406-2 and the B_clk signal from B_clock line 402, resulting in a clock pulse output from clock AND gate 410-2 onto clock line 2.

At time Tc, the control signal, B_clk and A_clk are the same as at time Ta, and clock line 1 again has a clock pulse as at time Ta. In addition, clock latch 406-3 has now been enabled by the A_clk signal to latch the high output of clock latch 406-2, thus resulting in clock-AND gate 410-3 outputting a clock pulse resulting from the high output of clock latch 406-2 and the A_clk signal from A_clock line 404. Clock line 2, whose signal is tied to the B_clk signal, remains low (no clock signal).

The staggering of the clock signals continues to propagate through to clock lines 4 and 5 as shown. Eventually, the control signal goes low, and the clock signals dissipate sequentially. That is, at time Tw, the control signal is low, and thus clock latch 406-1 outputs a low signal even when the A signal is high, since the clock AND gate 410-1 can not pass the A_signal through to clock line 1. This results in no clock signal at time Tw.

Since the output of clock latch 406-1 is now low, then when clock latch 406-2 is enabled by the next B_clk signal, clock latch 406-2 outputs a low signal, thus preventing any clock signal from passing through clock AND gate 410-2, resulting in clock line 2 remaining low (and missing clock signal represented by dotted line). The output of clock latch 406-1 remains low as long as the control signal remains low, and thus clock line 1 continues to have no clock signal. The clock signals continue to dissipate due to the timed low output of the clock latches 406, finally resulting in none of the clock lines (1–5) carrying a clock signal (at time Tz).

Figure 5A:
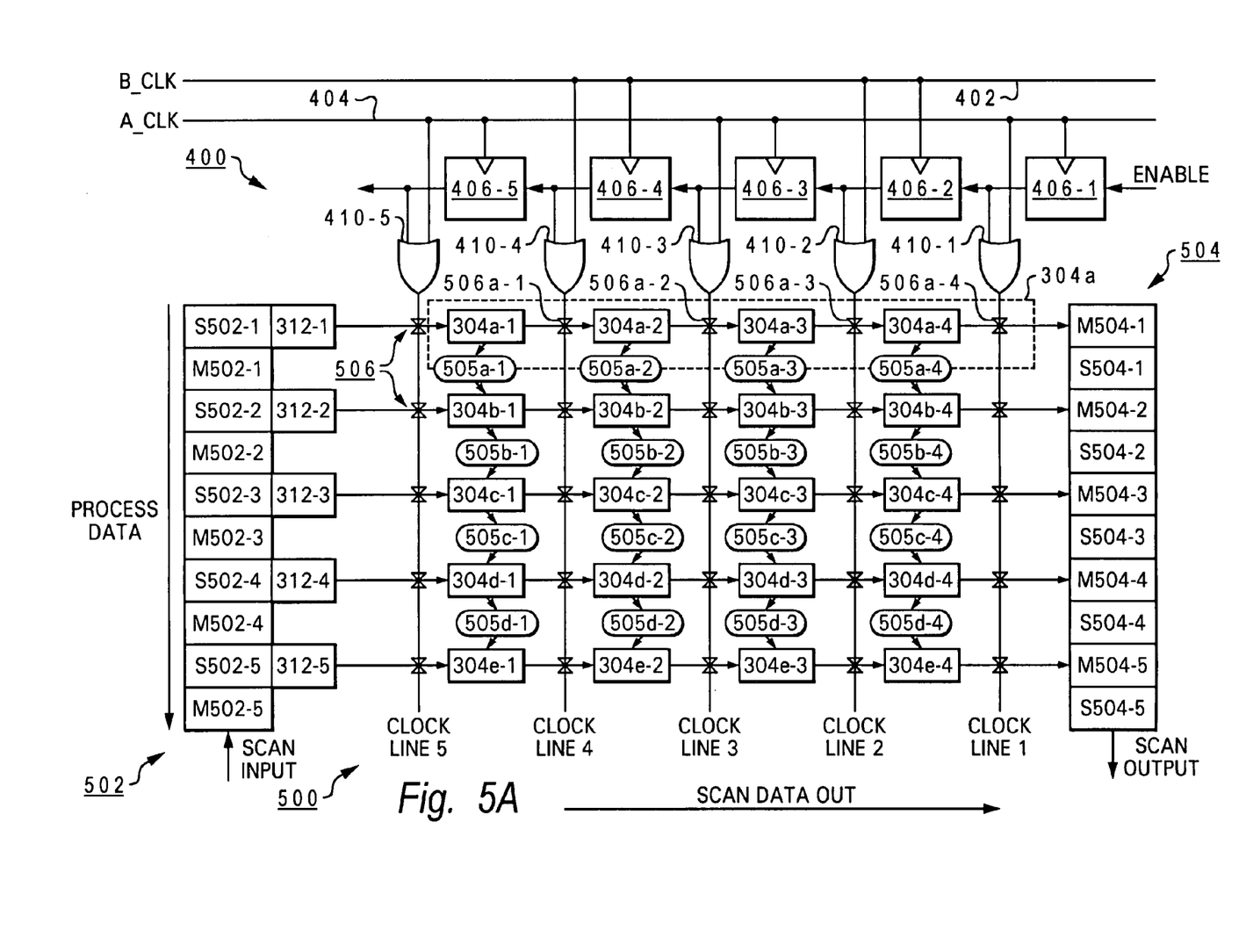
FIG. 5a depicts a preferred embodiment of the present invention, including an input register, an output register, a timing circuit and a state holding elements matrix for data to be scanned out.

With reference now to FIG. 5a, there is illustrated a preferred embodiment of the present invention, including timing circuit 400 and state holding elements matrix 500. For purposes of clarity and illustration, FIGS. 3a, 3b and 5a are viewed and described together.

Timing circuit 400, along with input register 502 and output register 504, facilitate the scanning of data out of state holding elements matrix 500 in a manner consistent with that illustrated in FIGS. 3a and 3b. State holding elements matrix 500 includes multiple rows of state holding elements such as latches 304. For example, latches 304a-1, 302a-2, 304a-3 and 304a-4 combine to form a row of state holding elements analogous to FIFO 302 described in FIG. 3a. Latches 304b-1 to 4, 304c-1 to 4, 304d-1 to 4, and 304e-1 to 4 each make up another row of state holding elements analogous to other FIFO's 302. For purposes of clarity, only the operation of the row of state holding elements identified in FIG. 5a as FIFO 304a are discussed. It is understood, however, that the other rows of state holding elements (latches 304) are preferably scanning out other data simultaneously with data being scanned out of FIFO 302a.

As described above, latches 304a-1 to 4 together are identified as FIFO 304a. At time T1, latch 304a-1 contains data "A", latch 304a-2 contains data "B", latch 304a-3 contains data "C", and latch 304a-4 contains data "D". At time T2, a clock signal on clock line 1 allows data "D" to pass through passgate 506a-4 from latch 304a-4 into output register master latch M504-1, thus initiating the scanning of data out of FIFO 304a. At time T3, data "D" is scanned into output register slave latch S504-1 (while continuing to be stored in output register master latch M504-1), and a clock signal on clock line 2 allows data "C" to pass through passgate 506a-3 from latch 304a-3 to latch 304a-4. At time T4, a clock signal on clock line 1 allows data "C" to pass though passgate 506a-4 from latch 304a-4 to output register master latch M504-1 (while data "D" passes from output register 504, preferably out from output register slave latch S504-1). Also at time T4, a clock signal on clock line 3 allows data "B" to pass through passgate 506a-2 from latch 304a-2 to latch 304a-3.

At time T5, a clock signal on clock line 2 allows data "B" to pass from latch 304a-3 to latch 304a-4, and a clock signal on clock line 4 allows data "A" to pass from latch 304a-1 to latch 304a-2.

At time T6, a clock signal on clock line 5 allows data "z" to pass from shadow latch 312-1 to latch 304a-1, a clock signal on clock line 3 allows data "A" to pass from latch 304a-2 to 304a-3, and a clock signal on clock line 5 allows data "B" to pass from latch 304a-4 to output register master latch M504-1.

At time T7, a clock signal on clock line 4 allows data "z" to pass from latch 304a-1 to latch 304a-2, and a clock signal on clock line 2 allows data "A" to pass from latch 304a-3 to latch 304a-4.

At time T8, a clock signal on clock line 5 allows data "y" to pass from shadow latch 312-1 to latch 304a-1, a clock signal on clock line 3 allows data "z" to pass from latch 304a-2 to latch 304a-3, and a clock signal on clock line 1 allows data "A" to pass from latch 304a-4 to output register master latch M504-1. At this point in time, all significant data has been scanned out of FIFO 304a, and subsequent scan steps are primarily for the purpose of re-loading FIFO 304a and the other rows of latches in state holding elements matrix 500 for subsequent logical data processing.

At time T9, a clock signal on clock line 4 allows data "y" to pass from latch 304a-1 to latch 304a-2, and a clock signal on clock line 2 allows data "z" to pass from latch 304a-3 to latch 304a-4.

At time T10, a clock signal on clock line 5 allows data "x" to pass from shadow latch 312-1 to latch 304a-1, and a clock signal on clock line 3 allows data "y" to pass from latch 304a-2 to latch 304a-3. Note that FIFO 304a is now "filling up" to remove any bubbles (empty or "don't care" latches) in FIFO 304a.

At time T11, a clock signal on clock line 4 allows data "x" to pass from latch 304a-1 to latch 304a-2.

At time T12, a clock signal on clock line 5 allows data "w" to pass from shadow latch 312-1 to latch 304a-1, thus completing the "reloading" of the row of state holding elements identified as FIFO 304a. As noted above, in a preferred embodiment, other rows of state holding elements, identified as 304b-1 to 4, 304c-1 to 4, 304d-1 to 4 and 304e-1 to 4, simultaneously scan other data through in a manner analogous to that described for FIFO 304a.

When data (scan data) is not scanned out as described above, data (process data) is pushed through and processed by processing units 505. Data is passed from latches 304 to processing units 505 and/or from one processing unit 505 to another processing unit 505 and/or from on latch 304 to another latch 304. The movement of process data through latches 304 and processing units 505 is under the control of a process controller 514 shown in FIG. 5c. Note that while, for purposes of illustrative clarity, connections and data flow are shown as being vertical for process data and horizontal for scan data, it is to be understood that scan and/or process data is able to move between latches 304 and/or processing units 505 in any direction that other connections (not shown) to latches 304 and processing units 505 allow.

In a preferred embodiment, passgates 506 depicted in FIG. 5a are single N type field effect transistors (NFET's) as illustrated in FIG. 5b as opposed to a full complement pass gate with both and NFET and PFET. A full complement pass gate would require the clock signal and it's complement. When using NFET only passgate it is necessary to drive the gate of the FET above the voltage of the signal that is being passed. A level shifter of the standard art placed after the clock AND gate can perform this function.

Referring now to FIG. 5c, there is depicted a block diagram of the preferred embodiment of the present invention. A scan controller 510, incorporating timing circuit 400, is coupled to elements matrix 500 to control the movement of scan data out of scan latches in elements matrix 500 as described in detail above. Also coupled to elements matrix 500 is a process controller 514, which coordinates the processing of data by and through elements matrix 500. That is, process controller coordinates the processing and movement of data through the processing elements in elements matrix 500. Process controller 514 moves process data into and out of specified processing elements in a coordinated manner according to the architecture of elements matrix 500.

Since concurrent control of elements matrix 500 by scan controller 510 and process controller 514 would result in havoc, controller coordinator 512 coordinates the mutually exclusive operation of scan controller 510 and process controller 514. That is, during normal process operations involving elements matrix 500, controller coordinator 512 enables process controller 514 while concurrently disabling scan controller 510. While scan controller 510 is disabled, process data is processed by the processing elements 505 in elements matrix 500 in a normal fashion. Alternately, when controller coordinator 512 disables process controller 514 and enables scan controller 510, process data no longer passes through processing elements 505, and the data in scan latches 304 is scanned out under the control of scan controller 510.

The present invention, as described in its preferred embodiment, is thus able to scan data out of a latch array, such as state holding elements matrix 500, without the need for slave latches for every latch being scanned. Thus, a smaller number of overhead latches are now needed within the state holding elements matrix 500. The present invention further affords a single elements matrix to have separate and distinct controllers, one for processing data and one for scanning out inter-process data between processing units 505.

It should be understood that at least some aspects of the present invention may alternatively be implemented in a program product. Programs defining functions on the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such single-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

While the invention has been particularly shown and described with reference to a preferred embodiment, it will be understood by those skilled in the art that various changes in form and detail may be made therein without departing from the spirit and scope of the invention.

What is claimed is:

1. A system for manipulating data in a state holding elements array, the system comprising:
   a process controller for moving process data through an array of processing units coupled to a state holding elements array;
   a scan controller for scanning scan data out of the state holding elements array, the scan controller including:
      a cascaded group of state holding elements, each of the state holding elements being a single unpaired state holding element;
      a clock shifter for controlling movement of data out of each state holding element in the cascaded group; and
      means for permitting shifting of a datum from a first state holding element in the cascaded group to a second state holding element in the cascaded group only if the second state holding element does not contain a valid datum at that time; and
   a controller coordinator for controlling a mutually exclusive operation of the process controller and the scan controller.

2. The system of claim 1, wherein the clock shifter comprises:
   a plurality of clock AND gates;
   a same clock input line connected to multiple clock AND gates in the plurality of clock AND gates; and
   a plurality of clock latches each having:
      a control input connected to an output of another clock latch,
      a clock input connected to the same clock input line, and
      a clock latch output each connected to one of the multiple clock AND gates,
   wherein the clock shifter splits a same clock input into sequentially propagating clock signals, such that at a first time, only a first clock AND gate in the multiple clock AND gates outputs a first cycle of a clock signal, and at a second subsequent time the first clock AND gate and a second clock AND gate output a second cycle of the clock signal.

3. The system of claim 1, further comprising:
   an output register comprising a plurality of receiving latches, each receiving latch being connected to a scan-out end of one of the rows of state holding elements.

4. The system of claim 1, wherein the state holding elements are latches.

5. A method for manipulating data in a state holding elements array, the method comprising:
  enabling a process controller, coupled to a state holding elements array, to move process data through an array of processing units coupled to the state holding elements array;
  enabling a scan controller, coupled to the state holding elements array, to scan data out of the state holding elements array, the scan controller:
    shifting a first valid datum out of a downstream state holding element in a cascaded group into a state holding element of an output register, the cascaded group including a plurality of single unpaired state holding elements;
    subsequently shifting a second valid datum from an first upstream state holding element into the downstream state holding element; and
    subsequently shifting a third valid datum from a second upstream state holding element into the first upstream state holding element, whereby each shift of valid data is into a holding element that does not contain valid data at the time of the shift; and
  enabling a controller coordinator to control a mutually exclusive operation of the process controller and the scan controller.

6. The method of claim 5, further comprising:
  controlling a timing of the shifting of the data out of the cascaded group such that the shifting ends when all data is shifted out of the cascaded group.

7. The method of claim 6, further comprising:
  shifting new data, from an input register, into the cascaded group such that each state holding element in the cascaded group contains unique data.

8. A computer readable medium containing a computer program product for manipulating data in a state holding elements array, the computer program product comprising:
  program code for enabling a process controller, coupled to a state holding elements array, to move process data through an array of processing units coupled to the state holding elements array;
  program code for enabling a scan controller, coupled to the state holding elements array, to scan data out of the state holding elements array, the scan controller:
    shifting a first valid datum out of a downstream state holding element in a cascaded group into a state holding element of an output register, the cascaded group including a plurality of single unpaired state holding elements;
    subsequently shifting a second valid datum from an first upstream state holding element into the downstream state holding element; and
    subsequently shifting a third valid datum from a second upstream state holding element into the first upstream state holding element, whereby each shift of valid data is into a holding element that does not contain valid data at the time of the shift; and
  program code for enabling a controller coordinator to control a mutually exclusive operation of the process controller and the scan controller.

9. The computer readable medium of claim 8, the computer program product further comprising:
  program code for controlling a timing of the shifting of the data out of the cascaded group such that the shifting ends when all data is shifted out of the cascaded group.

10. The computer readable medium of claim 8, the computer program product further comprising:
  program code for shifting new data, from an input register, into the cascaded group such that each state holding element in the cascaded group contains unique data.

* * * * *